(12) United States Patent
Kobayashi et al.

(10) Patent No.: US 11,221,371 B2
(45) Date of Patent: Jan. 11, 2022

(54) POWER STORAGE DEVICE INSPECTING METHOD AND POWER STORAGE DEVICE MANUFACTURING METHOD

(71) Applicant: TOYOTA JIDOSHA KABUSHIKI KAISHA, Toyota (JP)

(72) Inventors: Kiwamu Kobayashi, Anjo (JP); Takeshi Goto, Kasugai (JP); Naotaka Ide, Nagakute (JP); Ruri Tanaka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 43 days.

(21) Appl. No.: 16/853,363

(22) Filed: Apr. 20, 2020

(65) Prior Publication Data

US 2021/0011087 A1    Jan. 14, 2021

(30) Foreign Application Priority Data

Jul. 11, 2019 (JP) .............................. JP2019-129562

(51) Int. Cl.
*G01R 31/388* (2019.01)
*H01M 10/44* (2006.01)

(52) U.S. Cl.
CPC ........ *G01R 31/388* (2019.01); *H01M 10/446* (2013.01)

(58) Field of Classification Search
CPC .... G01R 31/388; G01R 31/385; G01R 31/52; G01R 31/389; G01R 31/3865; H01M 10/446; H01M 10/4285; H01M 10/04; Y02P 70/50; Y02E 60/10
USPC ......................................................... 324/426
See application file for complete search history.

(56) References Cited

U.S. PATENT DOCUMENTS

| | | | |
|---|---|---|---|
| 2018/0022383 A1* | 1/2018 | Kunihiro | ................ B62D 6/002 701/41 |
| 2019/0011502 A1 | 1/2019 | Kobayashi et al. | |
| 2019/0198942 A1 | 6/2019 | Kobayashi et al. | |

FOREIGN PATENT DOCUMENTS

| | | |
|---|---|---|
| JP | 2010-153275 A | 7/2010 |
| JP | 2019-016558 A | 1/2019 |
| JP | 2019-113450 A | 7/2019 |

\* cited by examiner

*Primary Examiner* — Farhana A Hoque
(74) *Attorney, Agent, or Firm* — Oliff PLC

(57) ABSTRACT

A power storage device inspecting method of inspecting a power storage device for an internal short circuit that includes: detecting an external resistance Re which is generated in an external circuit in a state in which probes of an external power supply are connected to external terminals of the power storage device; applying an initial output voltage VS(0) with which an initial device current IB(0) of a device current IB(t) is zero; applying an output voltage VS(t) from the external power supply to the power storage device; and determining an internal short circuit of the power storage device based on a change with time of the device current IB(t) or a stabilized device current IBs of the power storage device.

5 Claims, 8 Drawing Sheets

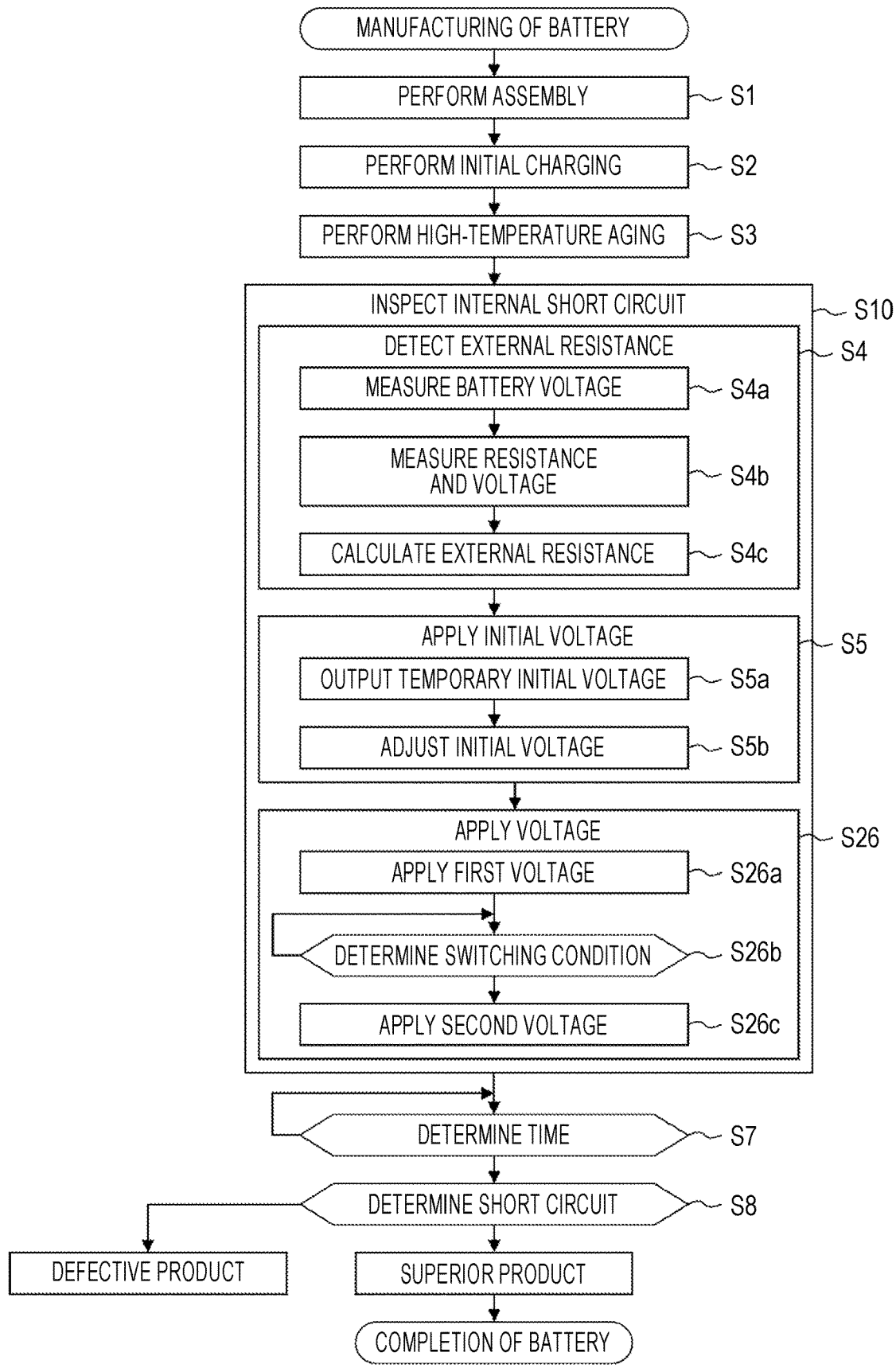

POWER STORAGE DEVICE INSPECTING METHOD AND POWER STORAGE DEVICE MANUFACTURING METHOD

INCORPORATION BY REFERENCE

The disclosure of Japanese Patent Application No. 2019-129562 filed on Jul. 11, 2019 including the specification, drawings and abstract is incorporated herein by reference in its entirety.

BACKGROUND

1. Technical Field

The disclosure relates to a power storage device inspecting method of inspecting for an internal short circuit of a power storage device and a power storage device manufacturing method including the power storage device inspecting method.

2. Description of Related Art

In manufacturing a power storage device such as a lithium-ion secondary battery, metal particles such as ion or copper may be mixed into an electrode assembly or the like and an internal short circuit (hereinafter simply referred to as a short circuit) may be generated in the power storage device due to the mixed metal particles. Accordingly, in the process of manufacturing a power storage device, or the like, it may be inspected whether an internal short circuit is generated in the power storage device.

A method of inspecting for an internal short circuit is disclosed, for example, in Japanese Patent Application Publication No. 2010-153275 (JP 2010-153275 A) (see the claims or the like of JP 2010-153275 A). That is, an assembled power storage device is first initially charged and then the power storage device is left alone at a high temperature. Thereafter, the power storage device is left alone to perform self-discharge (to discharge in a state in which terminals are open), and a voltage drop $\Delta Va$ is calculated from a device voltage which has been measured after the self-discharge. When the voltage drop $\Delta Va$ is greater than a reference voltage drop $\Delta Vb$ ($\Delta Va > \Delta Vb$), it is determined that an internal short circuit is generated in the power storage device. This inspection method may be performed as a process of a manufacturing method.

Japanese Patent Application Publication No. 2019-16558 (JP 2019-16558 A) discloses a short circuit inspecting method for a power storage device including a current detecting step of measuring a pre-detection device voltage VB1 of a precharged power storage device, continuously applying an output voltage VS (VS=VB1) which is equal to the pre-detection device voltage VB1 from an external power supply to the power storage device, and detecting a change with time of a device current IB and a stabilized device current IB s flowing in the power storage device and a determination step of determining an internal short circuit of the power storage device based on the detected change with time of the device current IB and the detected stabilized device current IBs.

SUMMARY

In the inspection method described in JP 2010-153275 A, there is a problem in that time is required for determining an internal short circuit. This is because when a left-alone time after the power storage device has been initially charged is not set to be long, a voltage drop which can be said to be significant is not acquired. One reason therefor is the presence of a contact resistance at the time of measurement of a voltage. Measurement of a voltage is performed by connecting a measuring instrument such as a voltmeter between external terminals of a power storage device. At this time, since a contact resistance is inevitably generated between the external terminals of the power storage device and probes of the measuring instrument or the like, the measured voltage value includes an influence of the contact resistance. The magnitude of the contact resistance varies whenever the probes of the measuring instrument are brought into the contact with the external terminals of the power storage device. Accordingly, when the generated voltage drop does not have a certain magnitude, unevenness in a voltage value at the time of measurement of a voltage due to the contact resistance cannot be ignored. Since measurement of a voltage is affected by a voltage drop in a power supply line at the time of measurement, the accuracy of measurement of a voltage cannot be enhanced.

On the other hand, in the inspection method described in JP 2019-16558 A, an internal short circuit of a power storage device is determined based on a change with time of a device current IB and a stabilized device current IBs instead of a voltage drop. Since measurement of a current can be performed with higher accuracy than measurement of a voltage, for example, it is possible to perform appropriate determination in a shorter time than in the inspection method described in JP 2010-153275 A.

A more rapid inspection technique is required for the inspection method described in JP 2019-16558 A as well as the inspection method described in JP 2010-153275 A. The disclosure provides a power storage device inspecting method and a power storage device manufacturing method in which an internal short circuit of a power storage device can be rapidly determined.

A power storage device inspecting method according to an aspect of the disclosure is a power storage device inspecting method of connecting probes of an external power supply to a pair of external terminals of a precharged power storage device to be inspected to form a closed circuit in which a device current IB(t) flows from the external power supply to the power storage device and inspecting the power storage device for an internal short circuit using the device current IB(t) flowing in the closed circuit. The power storage device inspecting method includes: an external resistance detecting step of connecting the probes of the external power supply to the pair of external terminals of the power storage device and detecting an external resistance Re which is generated in an external circuit outside the power storage device in the closed circuit; an initial voltage applying step of applying an initial output voltage VS(0) with which an initial device current IB(0) of the device current IB(t) is zero in a state in which the connection of the probes to the pair of external terminals is maintained; a voltage applying step of applying an output voltage VS(t) expressed by Equation (1) from the external power supply to the power storage device subsequently to the initial voltage applying step in a state in which the connection of the probes to the pair of external terminals is maintained, $$VS(t) = VS(0) + (Re - Ro1) \cdot IB(t) \qquad (1),$$

where a first virtual external resistance Ro1 is a constant satisfying $0 < Ro1 < Re$; and a short circuit determining step of determining an internal short circuit of the power storage device based on a change with time of the device current IB(t) or a stabilized device current IB s.

In the power storage device inspecting method, in a state in which connection of the probes of the external power supply to the pair of external terminals of the power storage device is maintained, the external resistance Re which is generated in the external circuit is detected, the initial output voltage VS(0) is applied, and the output voltage VS(t) based on Equation (1) is applied to the power storage device. Here, as can be seen from the fact that Equation (1) becomes $VS(t)=VS(0)+\Delta VS(t)$ when a voltage increase is defined as $\Delta VS(t)=(Re-Ro1)\cdot IB(t)$, the output voltage VS(t) is obtained by adding the voltage increase $\Delta VS(t)=(Re-Ro1)\cdot IB(t)$ to the initial output voltage VS(0). The voltage increase $\Delta VS(t)$ has a magnitude which is $Ro1\cdot IB(t)$ less than a voltage drop $Re\cdot IB(t)$ when the device current IB(t) flows in the external resistance Re. Accordingly, from the viewpoint of the power storage device, the external resistance Re is actually generated in the external circuit which is connected to the power storage device via the probes, but only the first virtual external resistance Ro1 which is less than the external resistance Re appears to be generated therein.

The external resistance Re includes a contact resistance between the probes of the external power supply and the external terminals of the power storage device. Accordingly, even when the same probes are connected to the same external terminals, the magnitude of the external resistance varies with every connection. The magnitude of the external resistance varies depending on the power storage device. Accordingly, even when the same output voltage VS is continuously applied to the power storage device as in the inspection method described in JP 2019-16558 A, a change with time or a convergence time of the device current IB(t) becomes uneven due to a difference of the external resistance Re. Accordingly, there is a problem in that the time at which it can be appropriately determined whether there is an internal short circuit becomes uneven.

On the other hand, with Equation (1), even when the external resistance Re of the external circuit varies, it appears from the viewpoint of the power storage device that the same first virtual external resistance Ro1 is generated in the external circuit as described above. Since the first virtual external resistance Ro1 has a value which is less than the actual external resistance Re, it is possible to shorten the time in which the device current IB(t) converges on the stabilized device current IBs and to shorten the time in which an internal short circuit of the power storage device can be determined based on the change with time of the device current IB(t) or the stabilized device current IBs.

In the power storage device inspecting method according to the aspect, the voltage applying step may include: a first voltage applying step of applying the output voltage VS(t) expressed by Equation (1) from the external power supply to the power storage device; a switching condition determining step of determining whether a predetermined switching condition has been satisfied; and a second voltage applying step of applying an output voltage VS(t) expressed by Equation (2) from the external power supply to the power storage device subsequently to the first voltage applying step in a state in which the connection of the probes to the pair of external terminals is maintained when the switching condition has been satisfied, $$VS(t)=VS(0)+(Re-Ro2)\cdot IB(t) \quad (2),$$

where a second virtual external resistance Ro2 is a constant satisfying $0<Ro1<Ro2<Re$.

As the set first virtual external resistance Ro1 becomes less, an increase of the device current IB(t) in the first voltage applying step becomes faster and the convergence progresses faster. On the other hand, as the first virtual external resistance Ro1 becomes less, fluctuation of the device current IB(t) due to disturbance is likely to increase and determination of whether the device current IB(t) has converged is likely to become more difficult. Examples of reasons for the disturbance include variation of the external resistance Re and variation of an environmental temperature. Since the external resistance Re includes a contact resistance, the external resistance often cannot be kept at strictly the same value in an inspection period. For example, when the probes are brought into press contact with the external terminals using a pneumatic actuator, a pressing force varies due to variation of an air pressure which is supplied to the actuator and a contact resistance between the probes and the external terminals varies. When the external resistance Re varies in this way, the output voltage VS(t) (the voltage increase $\Delta VS(t)$) and the device current IB(t) may vary unstably greatly.

On the other hand, in the above-mentioned aspect, when a predetermined switching condition has been satisfied, the second voltage applying step is performed using Equation (2) using the second virtual external resistance Ro2 instead of Equation (1) using the first virtual external resistance Ro1. Here, since the second virtual external resistance Ro2 is greater than the first virtual external resistance Ro1 ($0<Ro1<Ro2<Re$), convergence of the device current IB(t) progresses more slowly due to the switching but variation of the device current IB(t) is curbed. Accordingly, it is possible to appropriately determine an internal short circuit of the power storage device based on the change with time of the device current IB(t) or the stabilized device current IBs.

For example, a case in which a predetermined time has elapsed after the voltage applying step has started (t=0) or a case in which the device current IB(t) is greater than a predetermined value can be set as the switching condition. A second switching condition determining step and a third voltage applying step using the same expression as Equations (1) and (2) using a third virtual external resistance Ro3 satisfying $0<Ro1<Ro2<Ro3<Re$ may be additionally provided. In this case, since variation of the device current IB(t) is additionally curbed in the third voltage applying step, it is possible to more appropriately perform determination of an internal short circuit of the power storage device based on the change with time of the device current IB(t) or the stabilized device current IBs, which is performed thereafter.

In the power storage device inspecting method according to any one of the above-mentioned aspects, the external resistance detecting step may include a device voltage measuring step of measuring an open-circuit device voltage VBO of the power storage device, and the initial voltage applying step may include: a temporary initial voltage outputting step of outputting an output voltage VS which matches the measured open-circuit device voltage VBO; and an initial voltage adjusting step of adjusting the output voltage VS to the initial output voltage VS(0) such that the initial device current IB(0) of the device current IB(t) is zero.

In this inspection method, the open-circuit device voltage VBO is measured in advance and the initial output voltage VS(0) of the external power supply which is equal thereto is output. Here, as described above, accuracy of measurement of a voltage is likely to decrease. Therefore, the output initial output voltage VS(0) is adjusted such that the initial device current IB(0) of the device current is zero using the device current IB(t) which can be accurately measured. Accordingly, an initial output voltage VS(0) with which the initial device current IB(0) of the device current IB(t) is zero can be accurately and easily adjusted and can be applied to the power storage device. Accordingly, it is possible to start inspection of each power storage device with uniform conditions.

In the power storage device inspecting method according to any one of the above-mentioned aspects, the power storage device may have a flat rectangular shape, and the power storage device inspecting method may be performed under a condition in which the power storage device is pressurized in a thickness direction thereof.

By performing the inspection in a state in which the power storage device of a flat rectangular shape is pressurized in the thickness direction thereof, it is possible to perform inspection in which an influence of the presence of metal particles interposed between electrode plates of the power storage device is further emphasized. Accordingly, it is possible to more reliably inspect for an internal short circuit of a power storage device.

According to another aspect of the disclosure, there is provided a power storage device manufacturing method including: an initial charging step of initially charging an assembled uncharged power storage device to a predetermined state of charge to form a precharged power storage device; and an internal short circuit inspecting step of inspecting the precharged power storage device for an internal short circuit using the power storage device inspecting method according to any one of the above-mentioned aspects.

With the power storage device manufacturing method, it is possible to rapidly determine an internal short circuit of a power storage device in an inspection process which is a process of the manufacturing process. Accordingly, it is possible to shorten the time required for manufacturing a power storage device.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 8 is a flowchart illustrating a battery manufacturing method and an internal short circuit inspecting method of a battery according to the second embodiment.

DETAILED DESCRIPTION OF EMBODIMENTS

First Embodiment

Figure 1:
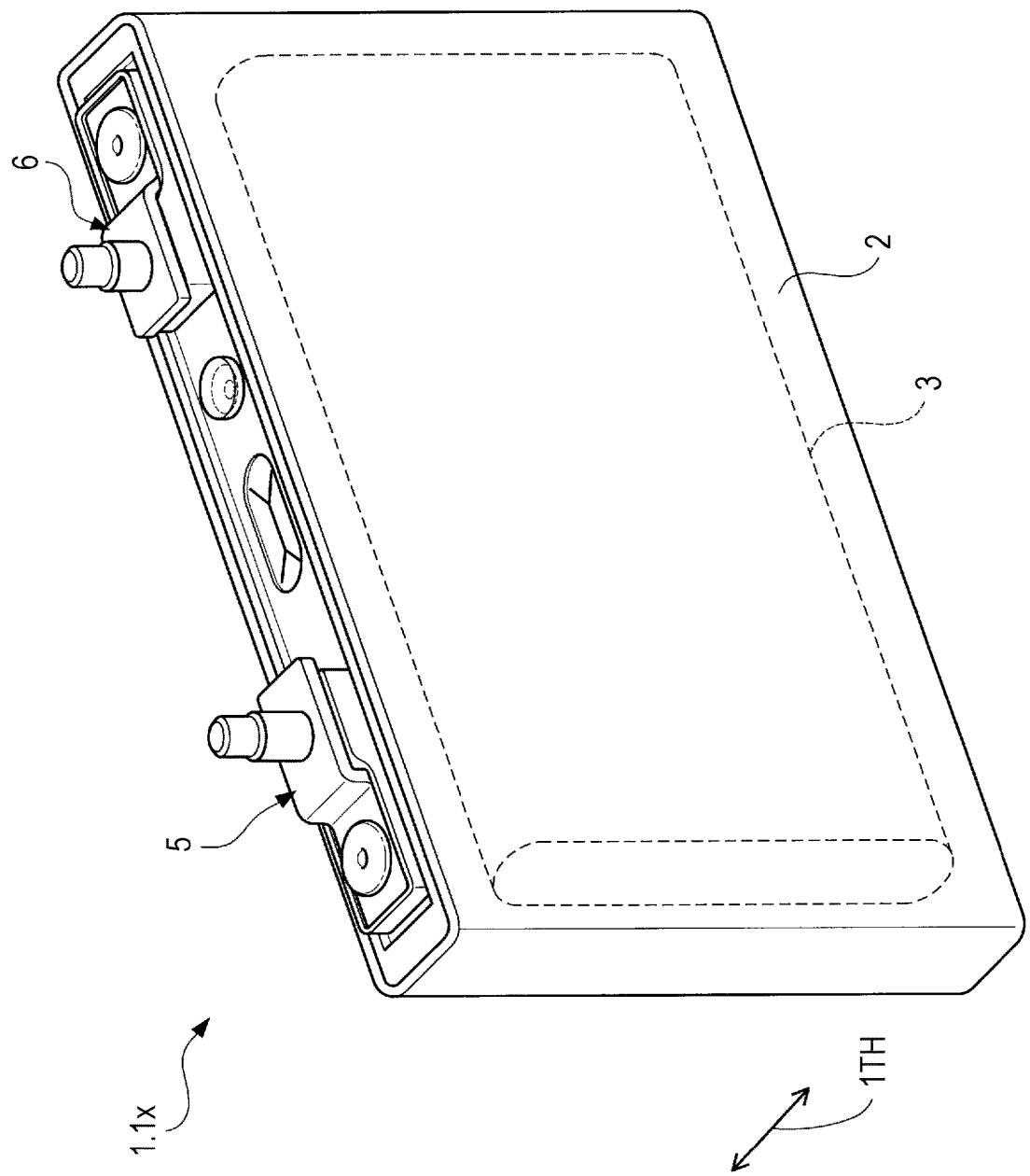
FIG. 1 is a perspective view of a battery which is manufactured and of which an internal short circuit is to be inspected according to first and second embodiments.

An embodiment of the disclosure will be described below in detail with reference to the accompanying drawings. A battery 1 which is a power storage device to be inspected will be first described below. The battery 1 illustrated in FIG. 1 is a sealed lithium-ion secondary battery of a flat rectangular shape which is mounted in a vehicle such as a hybrid vehicle, a plug-in hybrid vehicle, or an electric vehicle. A battery capacity Cb of the battery 1 according to the first embodiment is 5.0 Ah. The battery 1 includes a battery case 2, an electrode assembly 3 which is accommodated therein, and a positive-electrode external terminal 5 and a negative-electrode external terminal 6 which are supported in the battery case 2 and connected to the electrode assembly 3. An electrolyte (not illustrated) is accommodated in the battery case 2, with some of which the electrode assembly 3 is impregnated.

The electrode assembly 3 is a wound electrode assembly of a flat shape and is accommodated in the battery case 2 in a state in which an axis thereof lies sideways. The electrode assembly 3 is formed by alternately stacking a band-shaped positive electrode plate and a band-shaped negative electrode plate with a pair of separators, which is formed of a porous film of a resin in a band shape, interposed therebetween, winding the resultant structure around the axis, and compressing the resultant structure into a flat shape.

Figure 2:
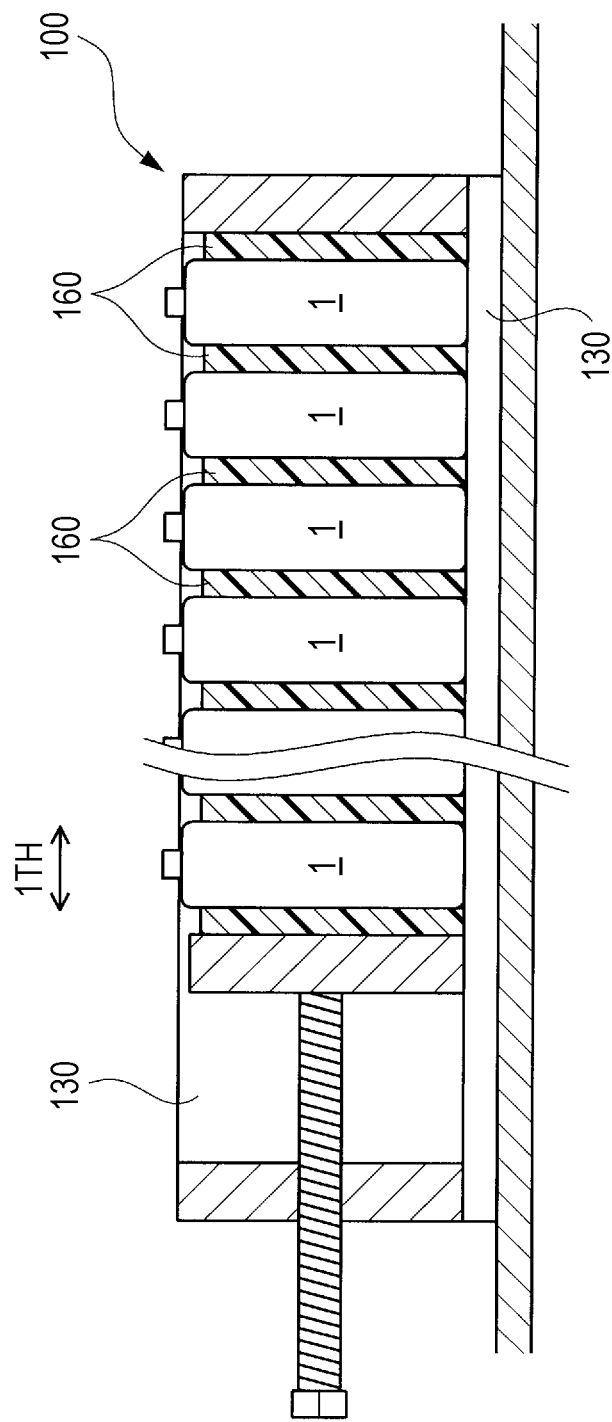
FIG. 2 is a diagram schematically illustrating a structure of a bound assembly which is obtained by alternately stacking a plurality of batteries having a flat rectangular shape and a plurality of spacers and binding the stacked body with a binding member according to the first and second embodiments.

One reason for an internal short circuit of the battery 1 which will be described later is metal particles which are interposed between the positive electrode plate and the negative electrode plate in the electrode assembly 3. Accordingly, when the battery 1 is inspected for an internal short circuit under the conditions in which the battery 1 is pressurized in a thickness direction 1TH illustrated in FIG. 1, it is possible to perform inspection in which an influence of interposed metal particles is further emphasized. Accordingly, it is possible to more reliably inspect the battery 1 for an internal short circuit. For example, as illustrated in FIG. 2, spacers 160 and a plurality of batteries 1 are alternately stacked, the batteries 1 are bound in the thickness direction 1TH with a binding member 130 to form a bound assembly 100, and then inspection for an internal short circuit can be performed.

Before describing a technique of inspecting the battery 1 (a power storage device) for an internal short circuit according to this embodiment, a fundamental principle of an internal short circuit inspecting method of a battery 1 will be first described (see JP 2019-16558 A).

Fundamental Principle

Figure 3:
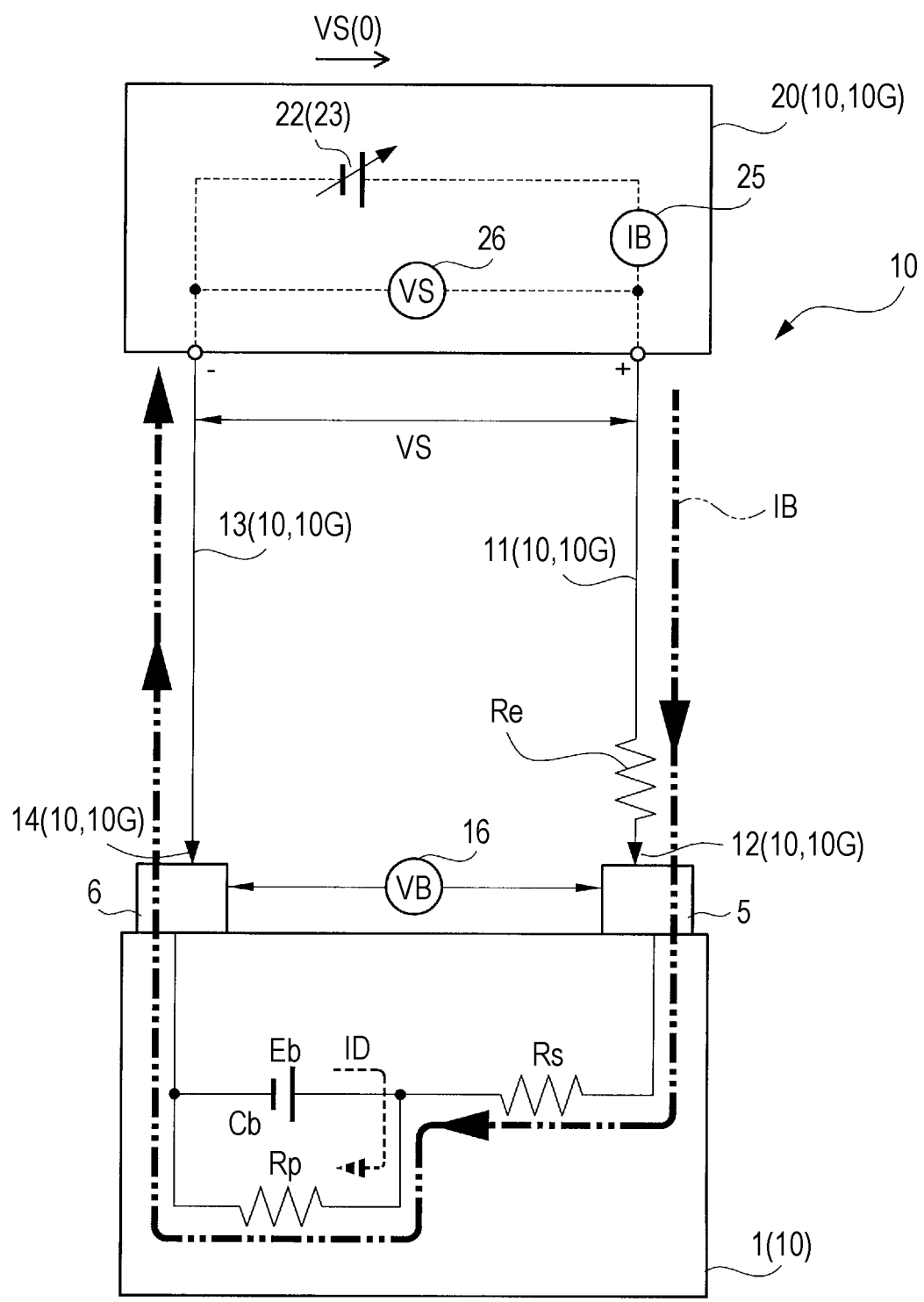
FIG. 3 is a circuit diagram illustrating a configuration of a basic circuit which is used to inspect for an internal short circuit of a battery based on a fundamental principle.

Inspection of a battery 1 for an internal short circuit is performed in a state in which an external power supply 20 is connected to the battery 1 to form a closed circuit 10 as illustrated in FIG. 3. The battery 1 has a flat rectangular shape illustrated in FIG. 1. This inspection for an internal short circuit is not limited to a battery of a flat rectangular shape illustrated in FIG. 1, and can be applied to a battery of another shape such as a cylindrical shape. In this embodiment, a plurality of batteries 1 is bound in the thickness direction 1TH with the binding member 130 and inspection for an internal short circuit is performed on each battery 1 (see FIG. 2).

The description will continue with reference to FIG. 3. In FIG. 3, an equivalent circuit of the battery 1 is illustrated, where the battery 1 includes a charged electromotive element Eb with a battery capacity Cb, a short-circuit resistor Rp which is connected in parallel to the electromotive element Eb, and an internal resistor Rs connected in series thereto. The internal resistor Rs is a direct-current (DC) resistor of the battery. The short-circuit resistor Rp is obtained by modeling a conductive path based on small metal particles which may be included in the electrode assembly 3 and an insulating resistance based on the separators. A battery current IB(t) is a current which flows from an external power supply 20 which will be described later to the battery 1, and a current ID is a self-discharge current which flows in the battery 1 (the short-circuit resistor Rp) with self-discharge of the electromotive element Eb.

On the other hand, the external power supply 20 includes a variable DC power supply 22, an ammeter 25, and a voltmeter 26. In the external power supply 20, the ammeter 25 for measuring a battery current is connected in series to the variable DC power supply 22 and measures the battery current IB(t) which flows from the external power supply 20 to the battery 1. On the other hand, the voltmeter 26 for measuring an output voltage is connected in parallel to the variable DC power supply 22 and measures an output voltage VS(t) of the external power supply 20. The external power supply 20 is a precise DC power supply which is configured to accurately measure the battery current IB(t) flowing out of the variable DC power supply 22 (the external power supply 20) using the ammeter 25 as well as to accurately measure the output voltage VS(t) generated from the variable DC power supply 22 using the voltmeter 26 and to variably and accurately perform control thereof.

The external power supply 20 and a positive-electrode external terminal 5 and a negative-electrode external terminal 6 of the battery 1 are connected to each other via connection lines 11 and 13. Specifically, probes 12 and 14 which are provided at tips (lower ends in FIG. 3) of the connection lines 11 and 13 are brought into contact with the positive-electrode external terminal 5 and the negative-electrode external terminal 6 of the battery 1, respectively. Accordingly, a closed circuit 10 is formed by the external power supply 20, the connection lines 11 and 13, and the battery 1. A circuit which is located outside the battery 1 and includes the external power supply 20 and the connection lines 11 and 13 is defined as an external circuit 10G. The voltmeter 16 for measuring a battery voltage may be used to measure a battery voltage VB(t) between the positive-electrode external terminal 5 and the negative-electrode external terminal 6 of the battery 1.

As illustrated in FIG. 3, an external resistor Re is present in the external circuit 10G. The external resistor Re includes conductor resistors of the connection lines 11 and 13, and contact resistors which are formed between the probes 12 and 14 and the external terminals 5 and 6 in addition to conductor resistors of elements in the external power supply 20. In FIG. 3, the external resistor Re is illustrated as if it were present in a lumped constant manner in the connection line 11. However, this is merely a representation for the purpose of convenience of describing the circuit, and in reality, the contact resistors between the probes 12 and 14 and the external terminals 5 and 6 out of the external resistor Re are actually generated at the contact ports and the conductor resistors are present over the entire external circuit 10G. The contact resistor which is generated between the probe 12 and the positive-electrode external terminal 5 and the contact resistor which is generated between the probe 14 and the negative-electrode external terminal 6 have different resistance values whenever the probes 12 and 14 are brought into contact with the external terminals 5 and 6. Accordingly, in inspection which will be described below, after the probes 12 and 14 have first been brought into contact with the external terminals 5 and 6, the contact is maintained until the inspection ends.

Figure 5:
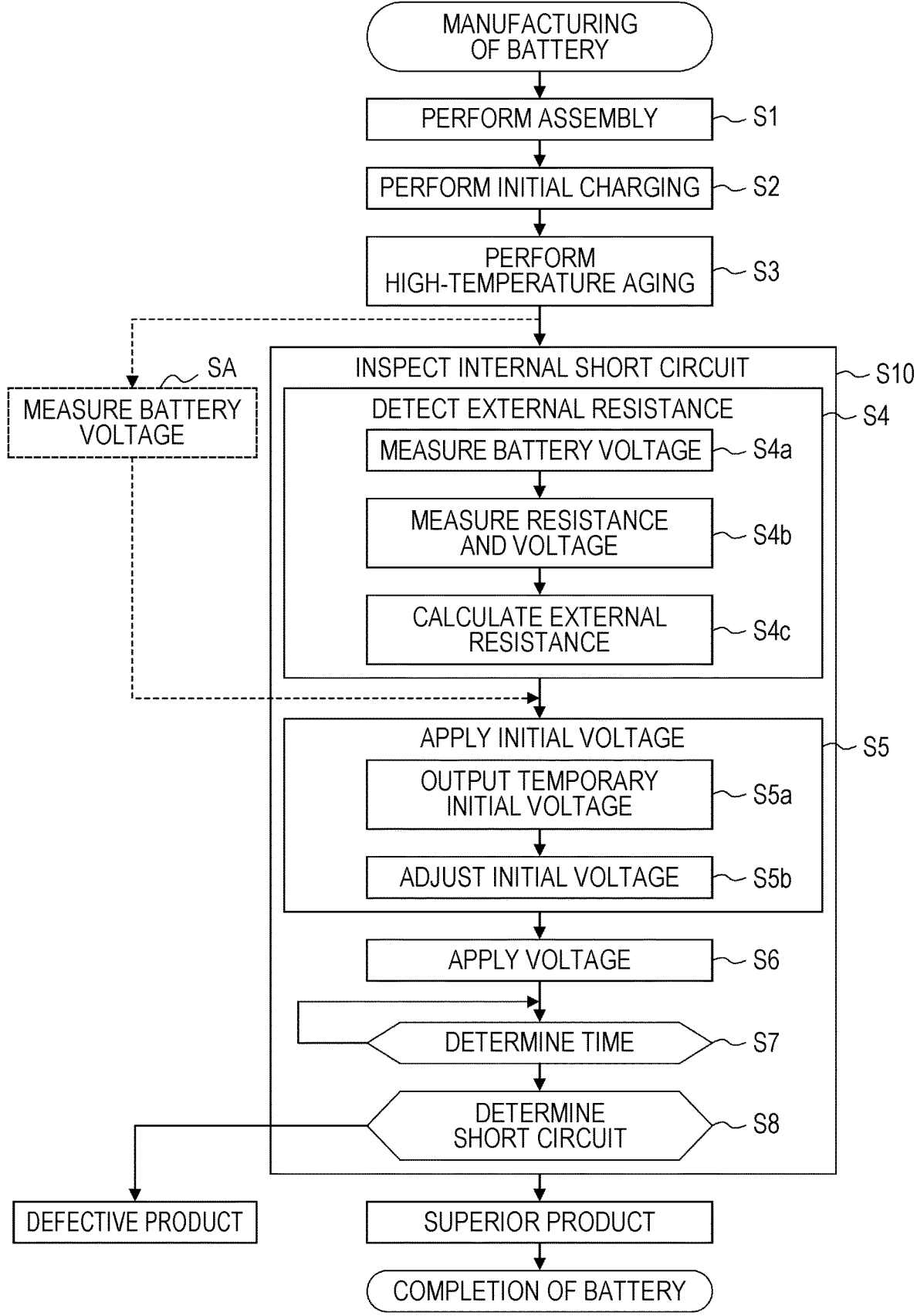
FIG. 5 is a flowchart illustrating a battery manufacturing method and an internal short circuit inspecting method of a battery according to the first embodiment.

First, a precharged battery is prepared as the battery 1. Specifically, as illustrated in FIG. 5, an uncharged battery 1*x* is assembled in an assembly step S1, and initial charging is performed to obtain a charged battery 1 in an initial charging step S2. In a high-temperature aging step S3, high-temperature aging of leaving the initially charged battery 1 alone under a high-temperature environment for a predetermined time is performed and then the battery 1 is cooled to the room temperature. Inspection for an internal short circuit is performed on the battery 1 in which the battery voltage VB(t) has been stabilized in this way.

Subsequently, in inspection for an internal short circuit associated with the fundamental principle, in a battery voltage measuring step SA, the probes 12 and 14 are connected to a pair of external terminals 5 and 6 to connect the external power supply 20 to the battery 1, the variable DC power supply 22 is turned off, and an open-circuit battery voltage VBO of the battery 1 is measured using the voltmeter 26 under the condition of the battery current IB=0 as indicated by a dotted line in FIG. 5. The pre-inspection open-circuit battery voltage VBO of the precharged battery 1 may be measured using a voltmeter 16 which is separately prepared before the external circuit 10G is connected thereto.

In an initial voltage applying step S5, an initial output voltage VS(0) which is generated by the variable DC power supply 22 of the external power supply 20 is adjusted to accurately match the open-circuit battery voltage VBO (VS(0)=VBO), and this voltage is applied to the battery 1.

Specifically, in a temporary initial voltage outputting step S5*a*, first, the output voltage VS which is generated by the variable DC power supply 22 of the external power supply 20 is adjusted to be substantially equal to the measured open-circuit battery voltage VBO. The adjustment at this time is temporary setting. This is because measurement accuracy of the acquired open-circuit battery voltage VBO is not high. Then, the probes 12 and 14 are brought into contact with the external terminals 5 and 6 to connect the external circuit 10G to the battery 1. Since the output voltage VS at this time is substantially equal to the open-circuit battery voltage VBO of the battery 1, the output voltage VS and the open-circuit battery voltage VBO of the battery 1 are almost balanced at that time, and no battery current IB flows in the closed circuit 10 (IB=0) or a slight battery current IB flows.

Therefore, in a subsequent initial voltage adjusting step S5*b*, the battery current IB flowing in the closed circuit is measured using the ammeter 25 and the output voltage VS generated by the variable DC power supply 22 is finely adjusted to accurately match the open-circuit battery voltage VBO (VS=VBO). Since measurement of a current using the ammeter 25 can be performed with higher accuracy than measurement of a voltage without being affected by the contact resistor or the like, the output voltage VS can be adjusted with high accuracy by fine adjustment of the current. Specifically, the fine adjustment is performed in a direction in which the output voltage VS decreases when the battery current IB is positive and in a direction in which the output voltage VS increases when the battery current IB is negative such that the battery current IB measured by the ammeter 25 is zero (IB=0). When the battery current IB is zero, the output voltage VS at the present time is maintained. The output voltage VS which has been finely adjusted in this way is mainly set as an initial output voltage VS(0). At time t=0, counting of a voltage application time t is started and inspection for an internal short circuit of the battery 1 using the external power supply 20 (the external circuit 10G) is started. Specifically, the output voltage VS(t) of the external power supply 20 is left at the initial battery voltage VB(0) (VS(t)=VS(0)=VBO: constant).

Figure 4:
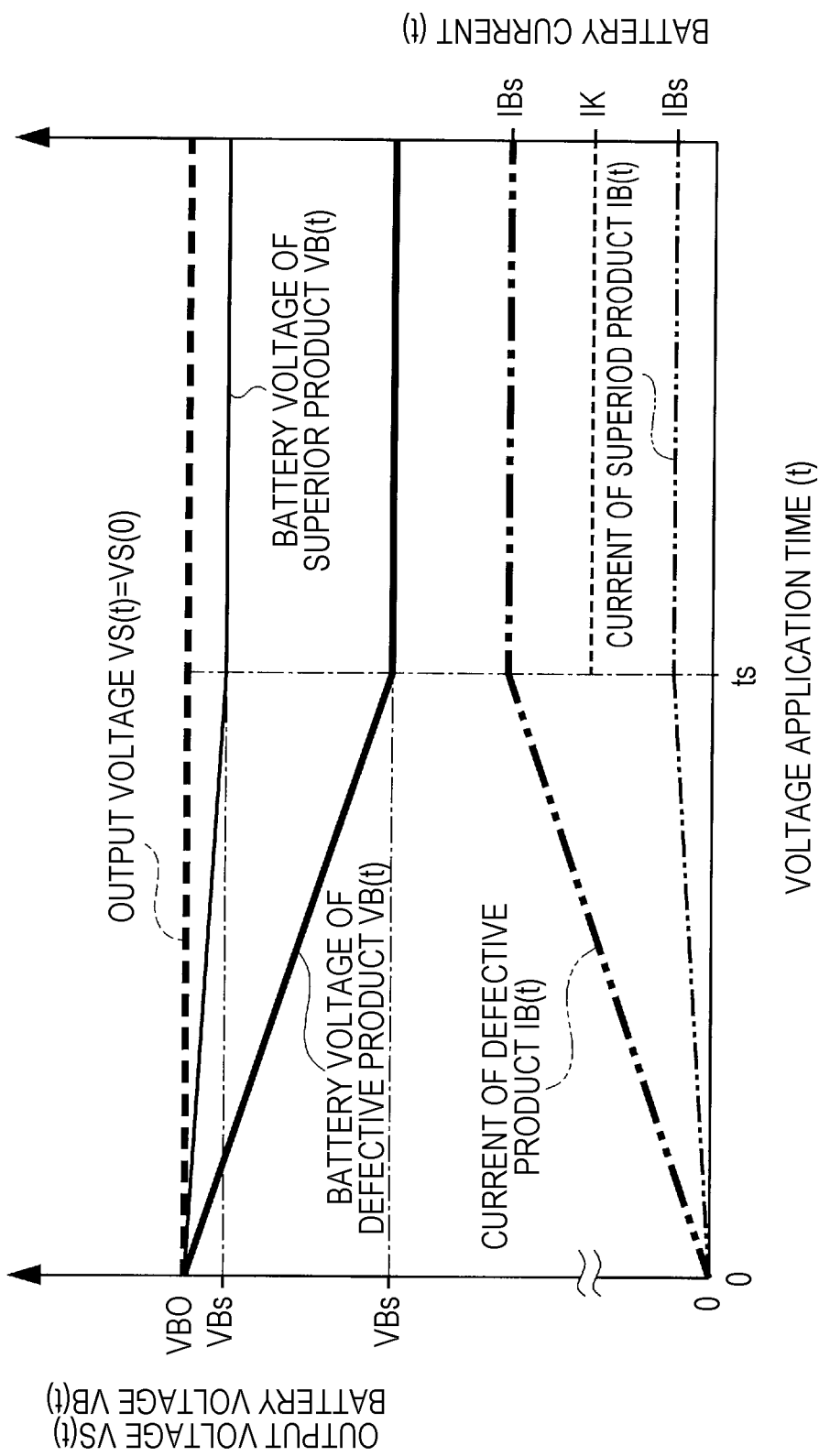
FIG. 4 is a graph schematically illustrating a relationship among a voltage application time t, an output voltage VS(t), a battery voltage VB(t), and a battery current IB(t) when the basic circuit illustrated in FIG. 3 is used in batteries with superior quality and defective quality.

Changes with time of the output voltage VS(t), the battery voltage VB(t), and the battery current IB(t) thereafter are illustrated in FIG. 4. In FIG. 4, the horizontal axis represents the voltage application time t, the left vertical axis represents the output voltage VS(t) and the battery voltage VB(t), and the right vertical axis represents the battery current IB(t). As the output voltage VS(t) indicated by a dotted line, the initial output voltage VS(0)=VBO is applied at start time t=0 which is the left end in FIG. 4 (an initial voltage applying step S5). Thereafter, the external power supply 20 maintains the output voltage VS(0) (a voltage applying step S6).

Then, in the battery 1, since a self-discharge current ID flows from the electromotive element Eb to the short-circuit resistor Rp, the voltage of the electromotive element Eb and thus the battery voltage VB(t) of the battery 1 decreases slowly. At this time, a great internal short circuit is generated, the self-discharge current ID in the battery 1 with "defective quality" in which the short-circuit resistor Rp is relatively small and which is indicated by a thick solid line is larger than that in the battery 1 with "superior quality" in which the short-circuit resistor Rp is relatively small and which is indicated by a thin solid line, and thus the battery voltage VB(t) also decreases fast and greatly.

On the other hand, when the battery voltage VB(t) is lower than the output voltage VS(t) (VS(t)<VB(t)), the battery current IB(t) corresponding to the magnitude of a voltage difference $\Delta V=VS(t)-VB(t)$ flows from the external power supply 20 to the battery 1 and the electromotive element Eb of the battery 1 is charged. In a stage in which the voltage difference $\Delta V=VS(t)-VB(t)$ is small, the battery current IB(t) is also small, thus the self-discharge current ID flowing out from the electromotive element Eb is larger than the battery current IB(t) flowing from the external power supply 20 into the battery 1, and the battery voltage VB(t) decreases slowly. However, when the battery voltage VB(t) further decreases and the battery current IB(t) increases to be equal to the magnitude of the self-discharge current ID (IB(t)=ID), that is, when the voltage application time t is a stabilization time is or later in FIG. 4 (tts), self-discharge of the electromotive element Eb stops. Accordingly, the decrease of the battery voltage VB stops and the battery voltage VB is maintained at a stabilized battery voltage VBs. The stabilized battery voltage VBs of a "defective product" is lower than the stabilized battery voltage VBs of a "superior product." The stabilized battery voltage VBs is also considered to have the magnitude of the following expression representing that the output voltage VS(t) (=VS(0)) of the external power supply 20 is divided by the external resistor Re and the resistor (Rs+Rp) of the battery 1: $VBs=VS(0) \cdot (Rs+Rp)/(Re+Rs+Rp)$.

On the other hand, the battery current IB(t) flowing from the external power supply 20 to the battery 1 increases slowly from IB(0)=0 (zero) at the time of start (t=0) with elapse of the voltage application time t. After the stabilization time ts has elapsed, the battery current becomes a constant stabilized battery current IBs. After the stabilization time ts has elapsed, it may be considered that the self-discharge current ID does not flow in the electromotive element Eb and the stabilized battery voltage VBs flows in a series circuit of the internal resistor Rs and the short-circuit resistor Rp. Since the battery current IB(t) can be measured without being affected by the control resistors or the like similarly to the battery voltage VB(t) and is measured directly using the ammeter 25 of the external power supply 20, the value thereof can be ascertained with high accuracy. In the battery 1 with "defective quality" indicated by a thick alternate long and two short dashes line, the self-discharge current ID is larger and the battery voltage VB decreases faster and more greatly in comparison with the battery 1 with "superior quality" indicated by a thin alternate long and two short dashes line, and thus the battery current IB(t) flowing from the external power supply 20 to the battery 1 also increases fast. Accordingly, the stabilized battery current IBs of a "defective product" is larger than the stabilized battery current IBs of a "superior product."

Therefore, a reference value IK is set in advance and it is determined whether there is an internal short circuit in the battery 1 by comparing an acquired stabilized battery current IBs therewith in a short circuit determining step S8. That is, it is determined that the battery 1 is a "defective product" with a large self-discharge current ID when the stabilized battery current IBs after having converged is larger than the reference value IK and that the battery 1 is a "superior product" with a small self-discharge current ID when the stabilized battery current IBs is smaller than the reference value IK.

A time determining step S7 of determining whether the time at which an internal short circuit is determined has come is performed before a short circuit determining step S8. An example of the time determining technique in the time determining step S7 is a technique of determining whether the battery current IB(t) has become a stabilized battery current IBs, that is, whether the battery current IB(t) has converged. Specifically, the battery current IB(t) is sampled at an appropriate frequency and it is determined that the battery current IB(t) has converged (has been stabilized) when fluctuation of the battery current IB(t) has become less than a predetermined reference. In addition, a technique of determining whether a predetermined time in which the battery current IB(t) is predicted to be stabilized has elapsed from the inspection start time (t=0) may be employed as the time determining technique.

A processing time required from the battery voltage measuring step SA to the short circuit determining step S8 in the internal short circuit inspecting method can be set to be shorter than a left-alone time in the technique of determining the magnitude of an internal short circuit based on a voltage drop due to self-discharge as JP 2010-153275 described in BACKGROUND. Since the battery current IB(t) which can be measured with high accuracy is measured instead of a voltage which is affected by the contact resistors or the like, it is possible to enhance determination accuracy. The fundamental principle of the internal short circuit inspecting method for the battery 1 using the external power supply 20 has been described hitherto. After the short circuit determining step S8, a battery 1 which has been determined to be a defective product is discarded, and a battery 1 which has been determined to be a superior product is additionally subjected to predetermined inspection and is completed as a battery 1.

Consideration of Convergence Time

In the circuit illustrated in FIG. 3, an expression of a battery current IB(t) is given as Equation (3). In Equation (3), since an internal resistance Rs of a battery 1 is much lower than an external resistance Re including contact resistances or the like (Re>>Rs), the internal resistance Rs is described to be absorbed in the external resistance Re (Re=Re+Rs).

$$IB(t) = \frac{R_e + R_p}{R_e R_p}\left(\frac{R_p V}{R_e + R_p} - E_b\right)e^{\frac{R_e + R_p}{R_e R_p C_b}t} + \qquad (3)$$

$$\frac{1}{R_e + R_p}V - \left(\frac{1}{R_e + R_p}V - \frac{E_b}{R_p}\right)e^{\frac{R_e + R_p}{R_e R_p C_b}t}$$

According to Equation (3), a time constant τ in convergence of the battery current IB(t) is defined as τ=Re·Rp·Cb/(Re+Rp), and the battery current IB(t) converges with elapse of a time t which is about three to five times the time constant τ based on characteristics of an exponential function et/τ. Since a short-circuit resistance Rp of the battery 1 is much higher than the external resistance Re (Rp>>Re), the time constant τ substantially becomes τ≈Re·Cb. That is, it can be understood that the length of time in which the battery current IB (t) converges is substantially proportional to the magnitude of the external resistance Re. Accordingly, as the external resistance Re becomes lower, the battery current IB(t) can converge earlier. Since the time constant τ is τ≈Re·Cb and does not include the short-circuit resistance Rp, it can also be understood that the convergence speed of the battery current IB(t) is not much affected by the magnitude of the short-circuit resistance Rp, that is, presence of an internal short circuit.

However, as described above, the external resistance Re includes the conductor resistances of the connection lines 11 and 13 and the contact resistances generated between the probes 12 and 14 and the external terminals 5 and 6 in addition to the conductor resistances of elements in the external power supply 20. Among these, a technique of changing materials to materials with lower resistances or the like may be employed to reduce the conductor resistances of the elements of the external power supply 20 or the conductor resistances of the connection lines 11 and 13, but the technique is difficult and an extent of reduction is limited. It is also difficult to reduce the magnitudes of the contact resistances which are generated between the probes 12 and 14 and the external terminals 5 and 6. Since the magnitude of the contact resistances and thus the magnitude of the external resistance Re varies with every connection, the convergence time of the battery current IB(t) varies. In this way, it is not easy to reduce the magnitude of the external resistance Re which is actually present and to curb unevenness of the external resistance.

Principle of Inspection for Internal Short Circuit According to Embodiment

In the inspection method based on the fundamental principle, the output voltage VS(t) which is generated from the variable DC power supply 22 of the external power supply 20 is fixed to the initial output voltage VS(0) as illustrated in FIG. 3. Accordingly, regarding the battery voltage VB(t), the external resistance Re such as the contact resistances appears to be present when the external circuit 10G is seen from the battery 1 as expressed by Equation (A).

$$VB(t) = VS(0) - Re \cdot IB(t) \qquad (A)$$

In the inspection method according to this embodiment, a first virtual external resistance Ro1 which is lower than the actual external resistance Re appears to be present in the external circuit 10G when seen from the battery 1 by controlling the output voltage VS(t) which is generated from the variable DC power supply 22 of the external power supply 20 such that the output voltage VS(t) changes according to the battery current IB(t).

Figure 6:
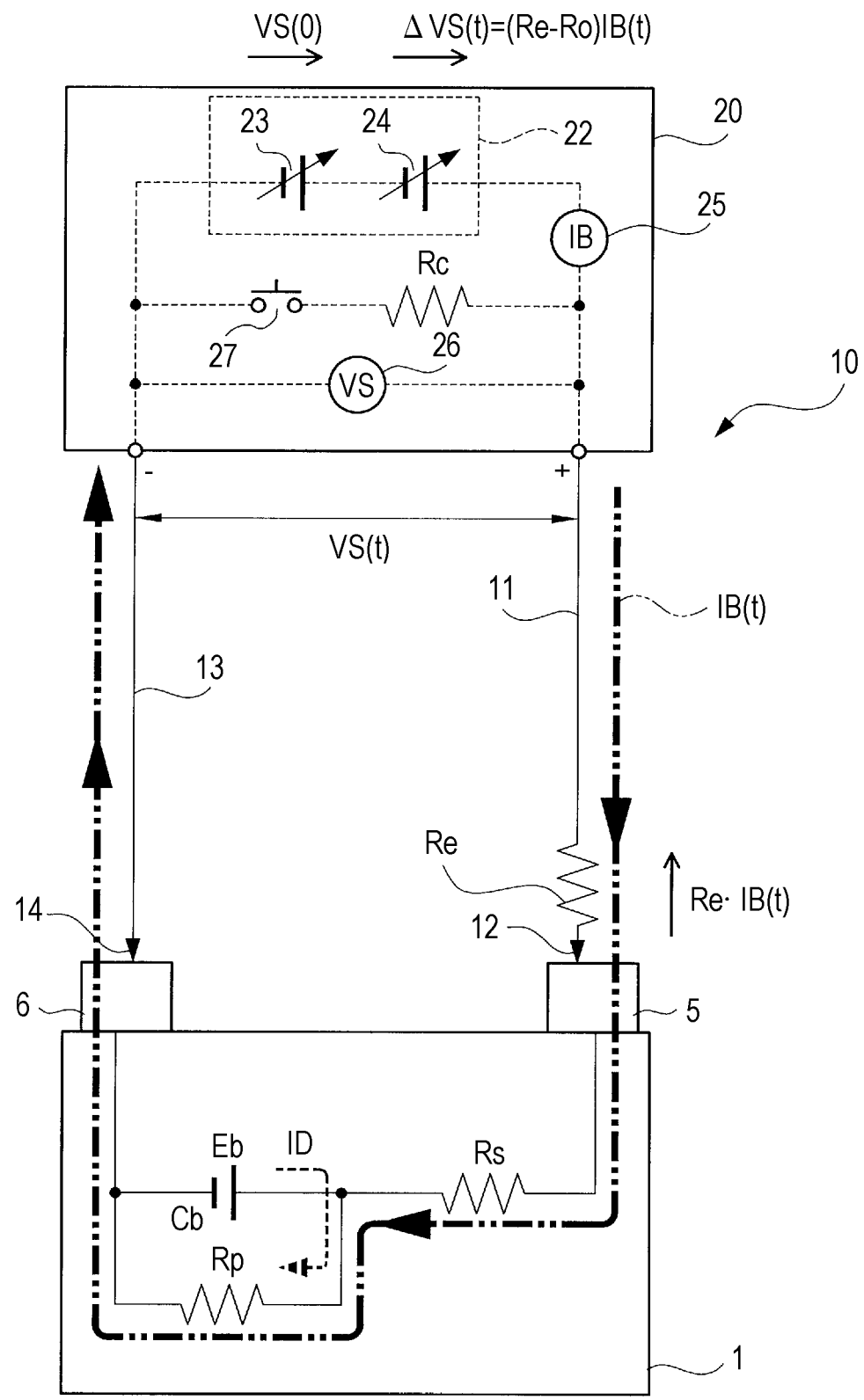
FIG. 6 is a circuit diagram illustrating a configuration of a circuit which is used to inspect for an internal short circuit of a battery according to the first and second embodiments.

FIG. 6 is a circuit diagram illustrating the configuration of a closed circuit 10 which is used to inspect for an internal short circuit of a battery 1 according to the first embodiment. The closed circuit 10 is the same as the circuit illustrated in FIG. 3 which is used to describe the fundamental principle. In the above description of the fundamental principle, the variable DC power supply 22 generates a fixed output voltage VS(0) which is equal to the pre-inspection open-circuit battery voltage VBO as the a output voltage VS(t) of the external power supply 20 and continues to output the fixed output voltage (VS(t)=VS(0)).

On the other hand, in the first embodiment, the output voltage VS(t) which is generated by the variable DC power supply 22 is set to VS(t)=VS(0)+ΔVS(t) as illustrated in FIG. 6. In FIG. 6, for the purpose of easy understanding, a variable DC power supply 24 that generates and outputs a voltage increase ΔVS(t) in addition to a variable DC power supply 23 that generates and continuously outputs a fixed output voltage VS(0) equal to the pre-inspection open-circuit battery voltage VBO as in the circuit illustrated in FIG. 3 is provided as the variable DC power supply 22. The variable DC power supplies 23 and 24 illustrated in FIG. 6 merely represent that the function of the variable DC power supply 22 that generates the output voltage VS(t) according to the first embodiment is divided into a part of a fixed initial output voltage VS(0) and a part of variation corresponding to the battery current IB(t), and do not represent that two variable DC power supplies 23 and 24 are actually provided.

Specifically, the variable DC power supply 24 generates a voltage ΔVS(t)=(Re−Ro1)·IB(t) as the voltage increase ΔVS(t). Here, Ro1 denotes a first virtual external resistance. That is, the variable DC power supply 22 (23, 24) of the external power supply 20 is controlled such that the output voltage VS(t) satisfies Equation (1) using the battery current IB(t) detected by the ammeter 25.

$$VS(t) = VS(0) + \Delta VS(t) \qquad (1)$$
$$= VS(0) + (Re - Ro1) \cdot IB(t)$$

Here, a relationship 0<Ro1<Re is satisfied. Accordingly, a difference between the external resistance Re and the first virtual external resistance Ro1 has a positive value (Re−Ro1>0), and the output voltage VS(t) is higher by the voltage increase ΔVS(t) than the initial output voltage VS(0).

On the other hand, when the battery current IB(t) flows in the external resistor Re, a voltage drop Re·IB(t) is generated as indicated by an arrow in FIG. 6, and thus the battery voltage VB(t) which is applied to the battery 1 is expressed by the following equation using Equation (1).

$$VB(t) = VS(t) - Re \cdot IB(t) \qquad (B)$$
$$= \{VS(0) + (Re - Ro1) \cdot IB(t)\} - Re \cdot IB(t)$$
$$= VS(0) - Ro1 \cdot IB(t)$$

As described above, the first virtual external resistance Ro1 is smaller than an actual external resistance Re (0<R01<Re). As can be easily understood from a result of comparison between Equation (B) and Equation (A), Equation (B) represents that the battery 1 appears to be connected to the external power supply 20 that continuously generates the output voltage VS(0) via the first virtual external resistance Ro1 which is smaller than the actual external resistance Re when the external circuit 10G is seen from the battery 1.

Accordingly, when the external power supply 20 is controlled in this way, the limit on the magnitude of the actual external resistance Re can be exceeded, the time constant $\tau$ for convergence of the battery current IB(t) can be maintained substantially at $\tau \approx Ro1 \cdot Cb$, and the battery current IB(t) can be made to converge on the stabilized battery current IBs rapidly. The time constant $\tau$ can be easily changed depending on the magnitude of the first virtual external resistance Ro1 which is to be set. That is, it can also be understood that it is possible to easily change and adjust the length of time until the battery current IB(t) converges on the stabilized battery current IBs.

In order to perform the above-mentioned control in the external power supply 20, the external resistance Re needs to be acquired before inspecting an internal short circuit. Since the external resistance Re includes contact resistances which are generated between the probes 12 and 14 and the external terminals 5 and 6 of the battery 1, the external resistance Re has different values such as Re=4.0Ω and 6.5Ω with every contact. Therefore, in this embodiment, after the assembly step S1 to the high-temperature aging step S3 has been performed and before the initial voltage applying step S5 is performed, the external resistance detecting step S4 indicated by a solid line is performed instead of the battery voltage measuring step SA indicated by a dotted line in FIG. 5. Specifically, the value of the external resistance Re including the contact resistances is detected as follows.

As illustrated in FIG. 6, in the external power supply 20 according to this embodiment, a relay 27 and a fixed resistor Rc which are connected in series to each other are connected in parallel to the voltmeter 26. In the external resistance detecting step S4, the open-circuit battery voltage VBO is measured using the voltmeter 26 in a state in which the variable DC power supply 22 (23, 24) of the external power supply 20 is turned off and the relay 27 is also turned off as the battery voltage measuring step S4a. This measurement of the open-circuit battery voltage VBO is the same as measurement of the open-circuit battery voltage VBO in the battery voltage measuring step SA. In a resistance and voltage measuring step S4b subsequent thereto, the relay 27 is turned on and a voltage value applied to the fixed resistor Rc which is provided in parallel to the voltmeter 26 is measured. In an external resistance calculating step S4c, the external resistance Re is calculated using the acquired two voltage values.

After the value of the external resistance Re has been acquired in this way in the external resistance detecting step S4, high-accuracy adjustment is performed such that the initial battery current IB(0) of the battery current IB(t) flowing from the external power supply 20 to the battery 1 becomes zero as described above in a state in which connection of the probes 12 and 14 to a pair of external terminals 5 and 6 is maintained, and the initial output voltage VS(0) is applied (the initial voltage applying step S5).

In a state in which connection of the probes 12 and 14 to a pair of external terminals 5 and 6 is maintained, the output voltage VS(t) which has been controlled such that it becomes VS(t)=VS(0)+(Re−Ro1)·IB(t) expressed by Equation (1) using the acquired external resistance Re is output from the external power supply 20, and is applied to the battery 1 (the voltage applying step S6). In the first embodiment, for example, a fixed value which is predetermined in a range of 0<Ro1<Re such as 0.1Ω or 1.0Ω is selected as the first virtual external resistance Ro1. The value of the external resistance Re which is used for Equation (1) is not changed but set to a fixed value during one time of inspection for an internal short circuit.

Thereafter, the time determining step S7 of determining whether the time at which determination of an internal short circuit can be performed has come is performed as described above. Unlike the case based on the fundamental principle in which the time constant $\tau$ with which the battery current IB(t) converges is proportional to the external resistance Re which is likely to vary ($\tau \approx Re \cdot Cb$), in this embodiment, the time constant $\tau$ with which the battery current IB(t) converges is substantially proportional to the set first virtual external resistance Ro1 ($\tau \approx Ro1 \cdot Cb$). Accordingly, even when inspection for an internal short circuit is performed on different batteries 1, unevenness in the time at which the battery current IB(t) converges (the length of the stabilization time ts) is not likely to occur. Accordingly, in the time determining step S7, a technique of determining whether a predetermined time in which the battery current IB(t) is predicted to be substantially stabilized (for example, a time length T=3Ro1·Cb of three times the time constant $\tau$ or a time length T=5Ro1·Cb of five times the time constant $\tau$) has elapsed from start of inspection (t=0) can be easily employed. When this technique is employed, the process for determining a time is facilitated. Subsequently, as described above, an internal short circuit of the battery 1 is determined based on the stabilized battery current IBs in which the battery current IB(t) has converged (see FIG. 4) (the short circuit determining step S8).

After the short circuit determining step S8, a battery 1 which is determined to be a defective product is discarded, and a battery 1 which is determined to be a superior product is additionally subjected to predetermined inspection and is then completed as a battery 1. That is, at the time of manufacturing the battery 1, inspection for an internal short circuit can be performed as an internal short circuit inspecting step S10 of inspecting a charged battery 1 including the external resistance detecting step S4 to the short circuit determining step S8 after the initial charging step S2 of initially charging an assembled uncharged battery 1x to a predetermined state of charge to form the charged battery 1 has been performed.

As described above, in the first embodiment, an external resistance Re is actually generated in the external circuit 10G but only a first virtual external resistance Ro1 appears to be generated. Since the first virtual external resistance Ro1 is smaller than the actual external resistance Re, it is possible to shorten a time (a stabilization time ts) until the battery current IB (t) converges on the stabilized battery current IBs. Accordingly, it is possible to shorten the time until an internal short circuit of the battery 1 can be determined based on the stabilized battery current IBs by comparing the stabilized battery current IBs with a reference value IK to determine an internal short circuit (see FIG. 4) or the like. In an inspection step which is a step of a process of manufacturing a power storage device, it is possible to rapidly determine an internal short circuit of the power storage device. Accordingly, it is possible to shorten a time for manufacturing the power storage device.

In the first embodiment, an internal short circuit of a battery 1 is determined based on the stabilized battery current IBs in which the battery current IB(t) converges and is stabilized after the stabilization time ts has elapsed. However, an internal short circuit of a battery 1 may be determined before the stabilization time ts has elapsed based on a change with time of the battery current IB(t) flowing from the external power supply 20 to the battery 1. For example, a change with time of the battery current IB(t) in a predetermined time period from t1 to t2 before the stabilization time ts has elapsed is detected and a current increase ΔIB (t1 to t2) of the battery current IB(t) increasing in the time period is calculated. When the current increase ΔIB (t1 to t2) is larger than a predetermined reference increase ΔIBk (ΔIB(t1 to t2)>ΔBk), the battery 1 may be determined to be a defective product. On the other hand, when the current increase ΔIB (t1 to t2) is equal to or smaller than the reference increase ΔIBk (ΔIB(t1 to t2)≤ΔBk), the battery 1 may be determined to be a superior product.

Second Embodiment

Figure 7:
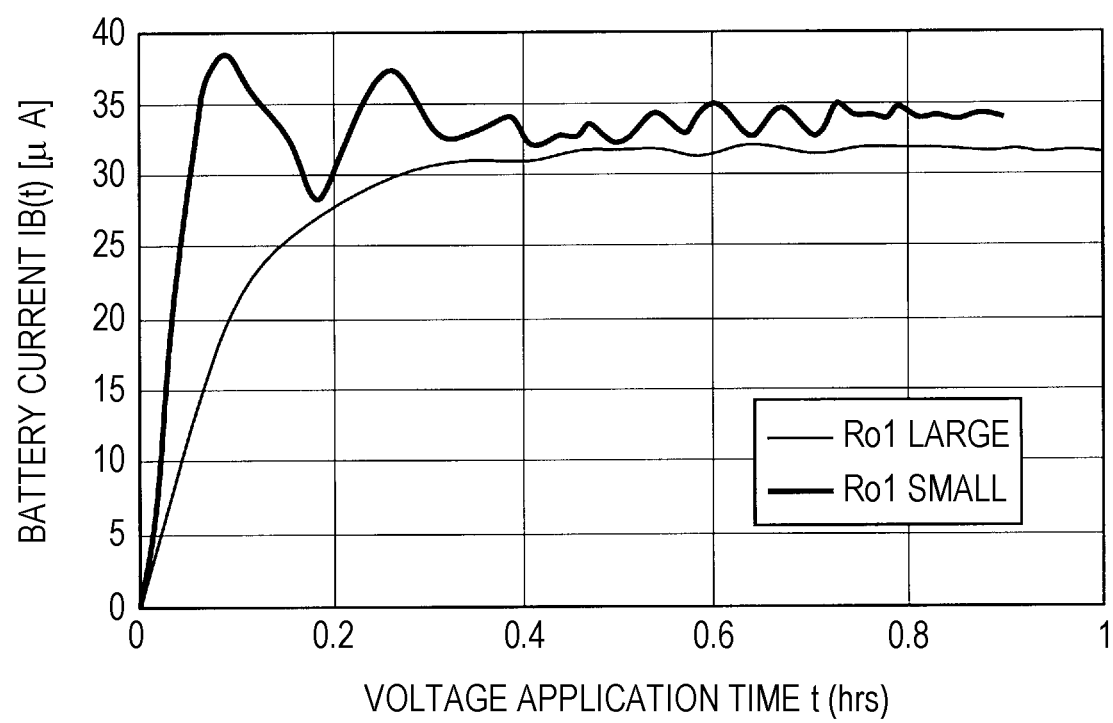
FIG. 7 is a graph illustrating a difference in change with time of a battery current IB(t) based on the magnitude of a first virtual external resistance Ro1.

In the first embodiment, an example in which the external power supply 20 is controlled using Equation (1) using the first virtual external resistance Ro1 has been described above. When the first virtual external resistance Ro1 is set to a small value, the time constant τ decreases and the stabilization time ts until the battery current IB(t) converges on the stabilized battery current IBs can be shortened. However, when the first virtual external resistance Ro1 is set to a small value, the battery current IB(t) can be easily affected by disturbance and the output voltage VS(t) (the voltage increase ΔVS(t)) and the battery current IB(t) may unstably vary greatly, for example, in comparison with a case in which the first virtual external resistance Ro1 is set to a large value as illustrated in the graph of FIG. 7. A reason of disturbance is variation of the external resistance Re which is actually present or variation of an environmental temperature, or the like. A reason of variation of the external resistance Re is variation of a pressing force for bringing the probes 12 and 14 into contact with the external terminals 5 and 6. The probes 12 and 14 are activated by a pneumatic actuator which is not illustrated. This is because the pressing force varies due to variation of an air pressure which is supplied to the actuator and the contact resistances between the probes and the external terminals vary.

Therefore, in a second embodiment, as illustrated in the flowchart of FIG. 8, a first virtual external resistance Ro1 and a second virtual external resistance Ro2 are selectively used in a voltage applying step S26 instead of the voltage applying step S6 in the first embodiment. That is, subsequent to the initial voltage applying step S5, the output voltage VS(t) of the external power supply 20 is controlled using Equation (1) which is the same as in the first embodiment as a first voltage applying step S26*a*.

$$VS(t)=VS(0)+(Re-Ro1)\cdot IB(t) \quad (1)$$

When the external power supply 20 is controlled using Equation (1) as described above, the time constant τ with which the battery current IB(t) converges becomes substantially τ≈Ro1·Cb.

Unlike the first embodiment, in the second embodiment, it is determined in a switching condition determining step S26*b* whether a predetermined switching condition has been satisfied. In the second embodiment, a technique of determining whether a predetermined time (specifically, the same time T=Ro1·Cb as the time constant τ) has elapsed from start of inspection (t=0) as the switching condition is employed. When the time T=τ elapses from the start of inspection (t=0), the battery current IB(t) is predicted to have a magnitude of about 63% of the stabilized battery current IBs and thus determination of a short circuit in the short circuit determining step S8 can be reliably and easily performed by curbing variation of the battery current IB(t) due to disturbance.

Therefore, after it is determined in the switching condition determining step S26*b* that the switching condition has been satisfied, the output voltage VS(t) of the external power supply 20 is controlled based on Equation (2) using the second virtual external resistance Ro2 instead of the first virtual external resistance Ro1 as the second voltage applying step S26*c*.

$$VS(t)=VS(0)+(Re-Ro2)\cdot IB(t) \quad (2)$$

Here, the second virtual external resistance Ro2 is a constant satisfying 0<Ro1<Ro2<Re. That is, Ro1<Ro2 is set.

Accordingly, the time constant τ with which the battery current IB(t) converges becomes substantially τ≈Ro2·Cb>Ro1·Cb, convergence of the battery current IB(t) is slower than that in the first voltage applying step S26*a* and time is required for convergence. Accordingly, determination of whether the time for determining an internal short circuit has come in the time determining step S7 is delayed. On the other hand, since the battery current IB(t) is not likely to vary due to disturbance as described above, it is possible to appropriately perform determination of an internal short circuit of a battery 1 based on the change with time of the battery current IB(t) or the stabilized battery current IB s. That is, determination of whether there is an internal short circuit in the battery 1 can be more reliably performed by comparing the acquired stabilized battery current IBs with the reference value IK in the short circuit determining step S8.

While the disclosure has been described above with reference to the first and second embodiments and the modified examples, the disclosure is not limited to the first and second embodiments and the modified examples and can be appropriately modified without departing from the gist of the disclosure. For example, the inspection method according to the embodiments is not limited to a second battery immediately after being manufactured as a new product, and may be performed on a used secondary battery, for example, for the purpose of reuse of a used battery pack. A power storage device which is a determination object is not limited to a secondary battery such as a lithium-ion secondary battery, and may be a capacitor such as an electrical double-layer capacitor or a lithium-ion capacitor.

For example, in the first and second embodiments, in the short circuit determining step S8, whether an inspected battery 1 is a superior product or a defective product is determined based on the magnitude of the stabilized battery current IBs or the current increase ΔIB However, the method of determining an internal short circuit is not limited thereto. For example, in the short circuit determining step S8, a degree of internal short circuit of an inspected battery 1 may be ranked based on the magnitude of the stabilized battery current IB s or the current increase ΔIB Specifically, a battery 1 may be classified into a superior product and a defective product and a battery with superior quality may be additionally classified into a plurality of ranks based on the magnitude of the stabilized battery current IBs or the current increase ΔIB.

In the second embodiment, the technique of determining whether a predetermined time has elapsed from the start of inspection (t=0) is employed as the switching condition in the switching condition determining step S26*b*. However, the switching condition may include a condition that the battery current IB(t) is larger than a predetermined value (for example, a condition that the battery current IB(t) has the magnitude of 63% of the stabilized battery current IBs which is predicted for a battery 1 with superior quality).

In the second embodiment, the first virtual external resistance Ro1 is replaced with the second virtual external resistance Ro2, but the second virtual external resistance Ro2 may be replaced with a third virtual external resistance Ro3. That is, a second switching condition determining step and a third voltage applying step of using the same equations as Equations (1) and (2) using the third virtual external resistance Ro3 satisfying 0<Ro1<Ro2<Ro3<Re may be additionally provided. In this case, since variation of the battery current IB(t) is additionally curbed in the third voltage applying step, determination of an internal short circuit of a battery 1 based on the change with time of the battery current IB(t) or the stabilized battery current IBs which is performed thereafter can be more appropriately performed.

What is claimed is:

1. A power storage device inspecting method of connecting probes of an external power supply to a pair of external terminals of a precharged power storage device to be inspected to form a closed circuit in which a device current IB(t) flows from the external power supply to the power storage device and inspecting the power storage device for an internal short circuit using the device current IB(t) flowing in the closed circuit, the power storage device inspecting method comprising:
   an external resistance detecting step of connecting the probes of the external power supply to the pair of external terminals of the power storage device and detecting an external resistance Re which is generated in an external circuit outside the power storage device in the closed circuit;
   an initial voltage applying step of applying an initial output voltage VS(0) with which an initial device current IB(0) of the device current IB(t) is zero in a state in which the connection of the probes to the pair of external terminals is maintained;
   a voltage applying step of applying an output voltage VS(t) expressed by Equation (1) from the external power supply to the power storage device subsequently to the initial voltage applying step in a state in which the connection of the probes to the pair of external terminals is maintained, $$VS(t)=VS(0)+(Re-Ro1)\cdot IB(t) \qquad (1)$$

where a first virtual external resistance Ro1 is a constant satisfying 0<Ro1<Re; and
   a short circuit determining step of determining an internal short circuit of the power storage device based on a change with time of the device current IB(t) or a stabilized device current IBs of the power storage device.

2. The power storage device inspecting method according to claim 1, wherein the voltage applying step includes:
   a first voltage applying step of applying the output voltage VS(t) expressed by Equation (1) from the external power supply to the power storage device;
   a switching condition determining step of determining whether a predetermined switching condition has been satisfied; and
   a second voltage applying step of applying an output voltage VS(t) expressed by Equation (2) from the external power supply to the power storage device subsequently to the first voltage applying step in a state in which the connection of the probes to the pair of external terminals is maintained when the switching condition has been satisfied, $$VS(t)=VS(0)+(Re-Ro2)\cdot IB(t) \qquad (2)$$

where a second virtual external resistance Ro2 is a constant satisfying 0<Ro1<Ro2<Re.

3. The power storage device inspecting method according to claim 1, wherein the external resistance detecting step includes a device voltage measuring step of measuring an open-circuit device voltage VBO of the power storage device, and
   wherein the initial voltage applying step includes:
      a temporary initial voltage outputting step of outputting an output voltage VS which matches the measured open-circuit device voltage VBO; and
      an initial voltage adjusting step of adjusting the output voltage VS to the initial output voltage VS(0) such that the initial device current IB(0) of the device current IB(t) is zero.

4. The power storage device inspecting method according to claim 1, wherein the power storage device has a flat rectangular shape, and
   wherein the power storage device inspecting method is performed under a condition in which the power storage device is pressurized in a thickness direction thereof.

5. A power storage device manufacturing method comprising:
   an initial charging step of initially charging an assembled uncharged power storage device to a predetermined state of charge to form the precharged power storage device; and
   an internal short circuit inspecting step of inspecting the precharged power storage device for the internal short circuit using the power storage device inspecting method according to claim 1.

* * * * *